United States Patent [19]
Koste et al.

[11] 3,956,052
[45] May 11, 1976

[54] RECESSED METALLURGY FOR DIELECTRIC SUBSTRATES

[75] Inventors: Walter W. Koste, Wappinger Falls; Ernest N. Urfer, Hopewell Junction, N.Y.

[73] Assignee: International Business Machines Corporation, Armonk, N.Y.

[22] Filed: Feb. 11, 1974

[21] Appl. No.: 441,196

[52] U.S. Cl. .............................. 156/247; 156/268; 156/272; 219/121 LM; 427/43; 427/53; 427/123; 427/272; 427/276; 427/287
[51] Int. Cl.² ..................................... B32B 31/00
[58] Field of Search .................. 156/3, 7, 8, 12, 13, 156/16, 89, 344, 24, 247, 268, 272; 204/DIG. 11; 219/121 L; 121 LM; 117/5.5, 38, 123 C, 212, 213, 217, 8.5; 427/43, 53, 272, 276, 282, 287, 123

[56] References Cited
UNITED STATES PATENTS

| | | | |
|---|---|---|---|
| 2,016,600 | 10/1935 | Gray | 117/8.5 |
| 3,189,978 | 6/1965 | Stetson | 156/89 X |
| 3,322,653 | 5/1967 | Morris | 156/3 |
| 3,333,334 | 8/1967 | Kuliczkowski et al. | 156/89 |
| 3,463,653 | 8/1969 | Letter | 117/8.5 |
| 3,505,139 | 4/1970 | Wentworth | 156/89 |
| 3,668,028 | 6/1972 | Short | 156/3 |
| 3,705,060 | 12/1972 | Stork | 156/3 |
| 3,770,529 | 11/1973 | Anderson | 156/3 |
| 3,867,217 | 2/1975 | Muggs et al. | 156/18 |

OTHER PUBLICATIONS

"Laser 'Via' Punching of Ceramic Green Sheet," J. A. Griesmer et al., IBM Technical Disclosure Bulletin, Vol. 15, No. 7, pp. 2303, 12-72.

*Primary Examiner*—William A. Powell
*Assistant Examiner*—Brian J. Leitten
*Attorney, Agent, or Firm*—Wesley DeBruin

[57] ABSTRACT

A ceramic green sheet material is metallized by laminating a thin organic material, preferably MYLAR, to a ceramic green sheet surface, and then employing an electron beam to define a predetermined pattern of openings extending through the organic material and selectively into and through the green sheet. The resulting channels and via holes are then filled with a metal paste. The organic mask is removed by peeling subsequent to the metal paste deposition step.

1 Claim, 1 Drawing Figure

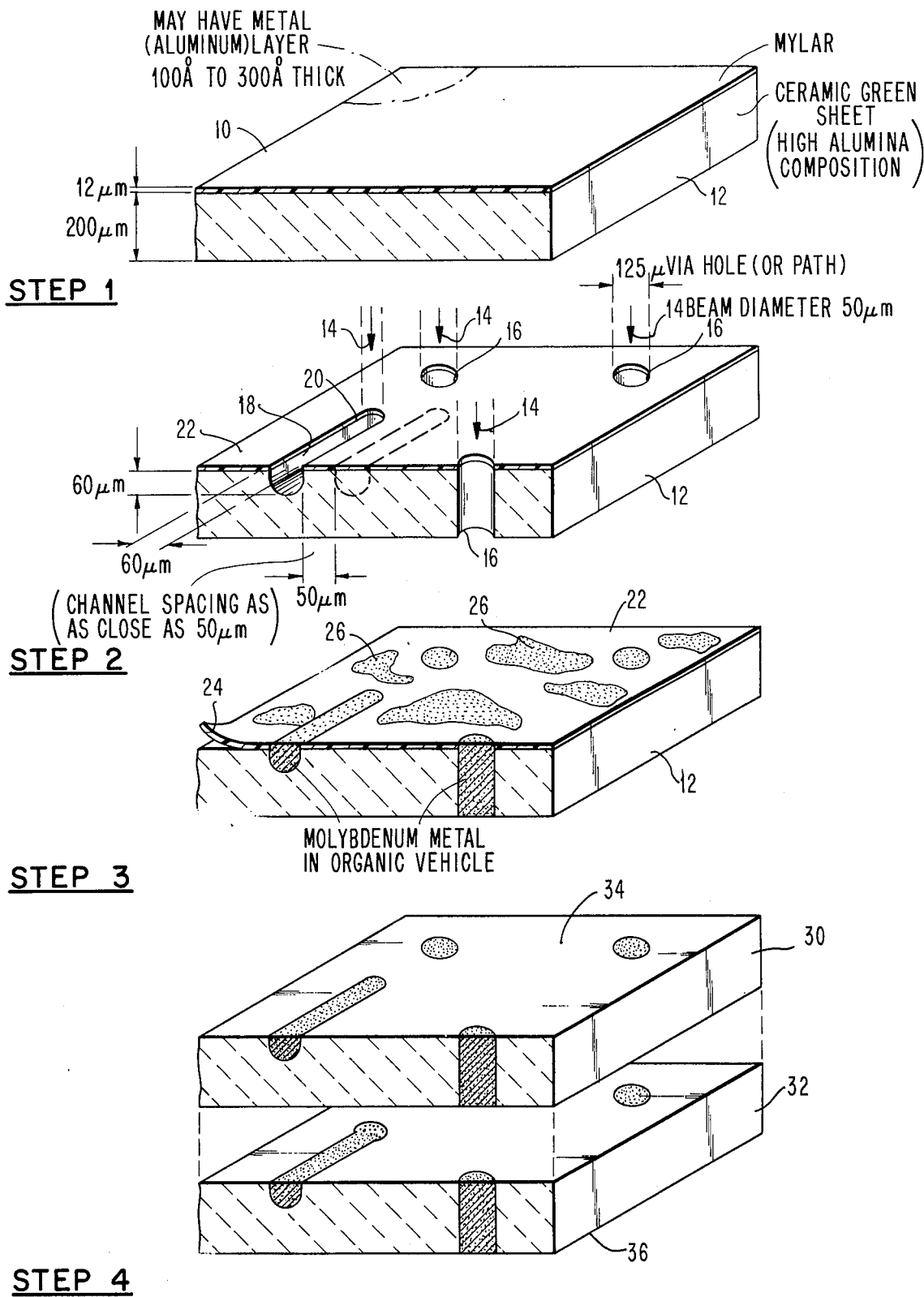

RECESSED METALLURGY FOR DIELECTRIC SUBSTRATES

BACKGROUND OF THE INVENTION

The invention relates to an electrical interconnection substrate and more particularly to a method of metallizing a green ceramic sheet.

RELATED UNITED STATES PATENT APPLICATION

Reference is made to abandoned U.S. Pat. application Ser. No. 371,925, filed June 20, 1973, by Andrew J. Juras, Walter W. Koste and Robert W. Kruppa, and entitled, RECESSED METALLURGY FOR DIELECTRIC SUBSTRATES.

BRIEF DESCRIPTION OF THE PRIOR ART

As disclosed in U.S. Pat. No. 3,770,529 granted Nov. 6, 1973 to Leslie C. Anderson, and of common assignee herewith, it is known to thermally machine a ceramic green sheet material by a stream of radiation to form via holes and channels therein. Much smaller holes can be formed than can be achieved with conventional mechanical machining. The recessed metallurgy approach achieves much finer line definition and allows closer spacing of adjacent lines thus improving the overall quality. Additionally, the recessed approach provides a more planar surface at the interface between adjacent sheets when used for multi-layer ceramic packages. This approach also achieves improved quality over chemical etching techniques in its ability to achieve finer line definition and avoidance of contamination due to entrapped chemicals.

Another approach which appears to be similar but is actually quite different than that of the present invention is found in the IBM Technical Disclosure Bulletin, Volume 10, No. 7, Dec. 1967, p.974. Therein is found a technique for the fabrication of ceramic electronic or interconnection structures wherein the ceramic material is formed with a photo-reactive binder and suitable solvent. Then a source of energy is directed through an appropriate photomask for defining the desired channels and interconnection vias. The areas exposed through the photomask become insensitive or insoluble to a developer. Water is used as the developer to remove the unreactive material in order to form the vias and channels so as to define the desired circuit pattern.

Another prior art teaching is found in a Metallurgical Transactions article entitled "Electron Beam Process of Interconnection Structures in Multi-Layer Ceramic Modules," by Walter W. Koste, Volume 2, March 1971, page 729. This article described electron beam thermal machining of a ceramic material similar to that employed in the present invention. However, this article does not disclose, teach or suggest the construction of a self-registering mask of an organic material (preferably MYLAR) laminated to the green sheet for use in filling the channels and via holes of the green sheet. The construction of the self-registering mask concurrently with the cutting of the channels and via holes in the green sheet is critical to the thermal machining approach where high resolution, high quality, high yield (fewer opens or shorts) interconnection ceramic packages are to be produced.

SUMMARY OF THE INVENTION

It is therefore an object of the present invention to provide a metallized interconnection pattern for a ceramic green sheet which possesses improved line definition.

Another object of the present invention is to provide a recessed metallized interconnection pattern for a ceramic green sheet material of improved quality which is advantageously suitable for fabricating multilayer ceramic interconnection packages.

A further object of the present invention is to provide an interconnection metallizing method for ceramic green sheet material which avoids chemical etching and thus improves the quality by avoiding the chemical contamination problems.

Another object of the present invention is to provide a recessed metallization process for a ceramic green sheet material which eliminates the need for separate mask fabrication and registration in the forming of complex and high resolution metallized lines.

Another object of the present invention is to provide a recessed metallization scheme for ceramic green sheet materials which employs a readily removable and disposable organic mask without requiring precise mask registration.

A further object of the present invention is to provide an improved interconnection system having lower resistance than systems produced by known techniques, due to the enlarged cross-sectional area of the conductors.

A further object of the present invention is to provide a method for metallizing a ceramic structure that is less sensitive to conductive paste rheology.

A further object of the present invention is to provide a metallization scheme for green ceramic material which is highly accurate for high quality fine line deposition and which is compatible to thermal machining by energy beams such as laser or electron beam.

Another object of the present invention is to provide a method for metallizing a ceramic structure, where changes in the circuit pattern may be readily implemented.

Another object of the present invention is to provide a metallization scheme for green ceramic material which is advantageously adaptable to dry or wet metal deposition techniques.

Another object of the present invention provides a method for depositing recessed metallurgy on green ceramic material by laminating to the green ceramic material a thin sheet or layer of a suitable organic material, (preferably polyethylene teraphthalate polyester, or MYLAR) having particular properties compatible with the dielectric substrate. The desired interconnection and via patterns are then thermally machined through the thin polyethylene teraphthalate polyester layer and into the dielectric substrate by an energy source such as a laser or electron beam. Thereafter, the metallic interconnection pattern is formed by deposition of a dry or wet metal material into the vias and channels formed in the dielectric substrate. The polyethylene teraphthalate polyester mask is then removed by peeling.

A further object of the present invention is a method for providing recessed metallurgy on green ceramic material by (1) laminating thereto a thin sheet of MYLAR, said sheet of MYLAR having a thin metallic layer on the surface remote from said green ceramic material (2) employing an electron beam to thermally cut channels and via holes in said green ceramic material by selectively impinging said electron beam on said thin metallic layer, (3) filling said channels and via holes in said green ceramic material with molybdenum paste (molybdenum metal in an organic binder) by employing said MYLAR sheet with the apertures cut therein by the electron beam, as a self-contained self registered mask (4) removing the mask preferably by peeling, from the green ceramic material containing channels and via holes filled with molybdenum paste.

A still further object of the present invention is a method for providing recessed metallurgy on an approximately 200 microns thick green ceramic material of a high alumina composition by (1) laminating thereto a thin sheet of MYLAR said sheet of MYLAR being approximately 12 microns thick and having a thin metallic layer aluminum, approximately 200A thick, on the surface thereof remote from said green ceramic material, (2) employing an electron beam approximately 50 um, or microns in diameter, 75 K.V. and 2 milliamperes, to thermally cut channels and via holes in said green ceramic material by selectively impinging said electron beam on said thin metallic layer (3) filling said channels and via holes in said green ceramic material with molybdenum paste (molybdenum metal in an organic binder) by employing said MYLAR sheet, with the remaining portion of the metallic layer thereon and the apertures cut therein by the electron beam, as a self-contained self registered mask and (4) removing the mask, preferably by peeling, from the green ceramic material containing channels and via holes filled with molybdenum paste. Where said via holes are well defined and approximately 125 microns in diameter, said channels are well-defined and approximately 60 microns wide and 60 microns deep, said channels being spaced as close as 50 microns one from another, and certain, or all, of said channels terminating in one, or more, via holes.

A still further object of the present invention is a method for providing recessed metallurgy on an approximately 200 microns thick green ceramic material of a high alumina composition by (1) laminating thereto a thin sheet of MYLAR, said sheet of MYLAR being approximately 12 microns thick, (2) employing an electron beam approximately 50 microns in diameter, 75 K.V. and 2 milliamperes, to thermally cut channels and via holes in said green ceramic material by selectively impinging said electron beam on said thin sheet of MYLAR, (3) filling said channels and via holes in said green ceramic material with molybdenum paste (molybdenum metal in an organic binder) by employing said MYLAR sheet with the apertures cut therein by the electron beam, as a self-contained self registered mask, and (4) removing the mask, preferably by peeling, from the green ceramic material containing channels and via holes filled with molybdenum paste. Where said via holes are approximately 125 microns in diameter, said channels are approximately 60 microns wide and 60 microns deep, said channels being spaced as close as 50 microns one from another, and certain, or all, of said channels terminating in one, or more, via holes.

BRIEF DESCRIPTION OF THE DRAWINGS

The sole FIGURE illustrates in Steps 1 through 4 the process for forming the recessed metallurgical channels and via holes of the present invention.

The dimensions and materials set-forth on the drawing are merely illustrative of those employed in the preferred embodiment.

DESCRIPTION OF THE PREFERRED EMBODIMENTS

In Step 1, a thin organic layer 10 (preferably MYLAR) is laminated by the application of pressure and temperature to a dielectric substrate 12. A suitable process for forming the ceramic green sheet of the preferred embodiment is found in an article entitled "A Fabrication Technique for Multi-Layer Ceramic Modules," H. D. Kaiser et al, Solid State Technology, May 1972, pp 35–40. The organic layer 10 should possess certain characteristics for optimum results. The organic material 10 should be mechanically strong in order to facilitate removal by peeling after the metal deposition. In addition to possessing mechanical strength the material should be thin enough so as to prevent an excess of metallurgy build-up above the dielectric layer which could squeeze out during subsequent lamination and short to an adjacent line (channel) or via.

It is also critical that the organic material be thermally compatible with the particular dielectric material used as the substrate member 12. Although the preferred embodiment of the present invention employs a ceramic green sheet material formed of a high alumina composition as substantially set forth in the Kaiser et al article, in combination with a polyethylene teraphthalate polyester organic layer 10, it is to be realized that other suitable combinations may be derived in light of the teachings of the present invention. It is important that thermal compatibility between the substrate 12 and the organic layer 10 be maintained in order to insure that the energy beam, and E beam source in the preferred embodiment, opens substantially identical sized or congruent holes in the layer 10 as that formed in the dielectric material 12 by thermal machining. Otherwise, during metal filling, the metal extends outside of the recessed channel or in the opposite situation the metal will not completely refill the channel and via interconnection holes.

As illustrated in Step 2 an energy beam schematically depicted at 14 is employed to form a plurality of via interconnection holes 16 and a recessed channel 18. Although the preferred embodiment employs thermal machining by use of an electron beam as taught in the previously mentioned article appearing in Metallurgical Transactions, Volume 2, March 1971, it is to be realized that an energy beam such as a laser source is also capable of thermal machining the substrate 12 to form the desired via interconnection holes and channels.

The use of a polyethylene teraphthalate polyester layer 10 in combination with the high alumina ceramic green sheet material 12 is particularly advantageous because of their mutual matching thermal compatibility in the environment of the present process in that at a temperature of about 250° C during the E beam thermal machining, the polyethylene teraphthalate polyester softens so as to provide a thermal bonding right at the edges of the cavities or via interconnection holes, as illustrated at interface 20. As a result, during the subsequent metal filling step, the metal is prevented from going between the dielectric surface and the organic mask and thus avoids the possibility of shorting between adjacent lines in the one to two mil spacing range. Further, the illustrated material 10 laminates well to the dielectric substrate by means of a pure adhesive bond and thus prevents slipping during the subsequent metal filling step. Thus, the thermal etching results in a self registered mask 22 being formed from the original layer 10. It is noted that polyethylene teraphthalate polyester is commercially available in one form, e.g. MYLAR (trademark of the DuPont Corporation). MYLAR is defined on page 70 in the "Concise Chemical and Technical Dictionary" edited by H. Bennett, copyright 1962, Chemical Publishing Company, Inc., New York, N.Y. as follows:

MYLAR. Brand name for very thin films of polyethylene teraphthalate; used for insulating, as recording tapes, many other industrial applications (E. I. duPont de Memours & Co. Wilmington, De.).

In Step 3, the organic mask 22 defines a predetermined pattern for forming metallized channel and interconnection via holes. In the preferred embodiment a wet metal material is deposited over the organic mask 22 by conventional means such as rolling, wiping, doctor blading, etc. In the preferred embodiment a suitable material comprises 83 weight percent molybdenum metal with a 2.5 um (Micron) Fisher sub-sieve particle size dispersed in a suitable organic vehicle that is compatible with the ceramic green sheet process. Compatible vehicles are selected such that during subsequent firing operations, the vehicles can be readily driven off without damaging the interconnection package. An example of a suitable paste vehicle is ethyl cellulose in butyl CARBITOL acetate. Although the preferred embodiment employs a wet metal filling technique, dried powder techniques can also be employed at Step 3.

CARBITOL is defined on page 177 in the "Concise Chemical and Technical Dictionary" edited by H. Bennett, copyright 1962, Chemical Publishing Company, Inc., New York, N.Y. as follows: "CARBITOL. See diethylene - glycol - mono - ethyl ether."

After the metal deposition, the continuous organic mask 22 may be readily stripped away by peeling as illustrated by the turned up corner 24 so as to remove the undesired metal as depicted at 26 and leave a precisely defined ceramic green sheet layer having recessed metallurgy deposited in interconnection vias and channels shown in Step 4.

Step 4 further illustrates that a plurality of the ceramic green sheet substrates 30 and 32 having recessed metallurgy deposited therein can be readily laminated and then fired according to well known techniques to form a multi-layer ceramic interconnection package. Although only two layers are shown for the purpose of simplicity, any number of ceramic layers can be laminated together. Integrated circuit chips can then be bonded to the upper surface 34 of the multi-layer ceramic package and any desired type of interconnection, such as pinning or lead frame can be employed to contact the lower-most surface shown at 36 so as to communicate with the outside world.

In certain high speed machining applications of a laminate consisting of an organic film and a dielectric substrate it has been found advantageous to employ a thin metallic film on the surface of the organic film on which the electron beam impinges. In particular, an aluminum film in the order of 200A in thickness, has been found advantageous to eliminate build-up of surface charges when high rates of electron beam machining are utilized.

In the preferred embodiment via conductors 125 microns in diameter and conductive channels 60 microns in depth and 60 microns in width were obtained in a dielectric substrate having a thickness of 200 microns. An organic film (MYLAR) having a thickness of 12 microns was employed. A 75 K.V., 2 milliampere electron beam having a focused diameter of 50 microns produced an opening in the MYLAR and dielectric substrate of 125 um (microns) in diameter when applied for 30 microseconds. The same electron beam swept at a speed of 10 meters per second produced a 60 micron channel (60 micron depth, 60 micron width) in the dielectric. The channels and via holes cut in the dielectric were well-defined and the aforerecited dimensions are reasonably accurate.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A method of depositing on a dielectric substrate recessed metallized interconnection channels and metallized vertical via conductive paths comprising the steps of:
   a. laminating an organic masking layer onto a dielectric substrate;
   b. thermally machining interconnection channels and vertical via paths through said masking layer into said dielectric substrate and simultaneously forming said organic masking layer into a self-registered mask, said mask having openings of substantially identical planar geometry to that of the underlying interconnection channels and vertical via paths;
   c. coating a metallic conductive material through said mask openings into said recessed interconnection channels and vertical via paths;
   d. and peeling away said organic masking layer from said dielectric substrate, whereby said dielectric substrate has said recessed metallized interconnection channels and metallized vertical via paths formed therein.

* * * * *